United States Patent
Kawashima et al.

(10) Patent No.: US 8,164,754 B2
(45) Date of Patent: Apr. 24, 2012

(54) IMMERSION EXPOSURE APPARATUS AND DEVICE MANUFACTURING METHOD

(75) Inventors: Haruna Kawashima, Haga-gun (JP); Nobuyuki Saito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 569 days.

(21) Appl. No.: 12/431,238

(22) Filed: Apr. 28, 2009

(65) Prior Publication Data
US 2009/0268176 A1 Oct. 29, 2009

(30) Foreign Application Priority Data
Apr. 28, 2008 (JP) .................................. 2008-116607

(51) Int. Cl.
*G01N 21/55* (2006.01)
*G03B 27/42* (2006.01)
(52) U.S. Cl. .............................. 356/445; 355/53; 355/67
(58) Field of Classification Search .................... 355/53, 355/67; 356/399–401, 445–448
See application file for complete search history.

(56) References Cited

U.S. PATENT DOCUMENTS

| 7,442,908 | B2 * | 10/2008 | Schuster | 250/201.2 |
| 7,630,058 | B2 * | 12/2009 | Kawashima et al. | 355/67 |
| 2003/0020893 | A1 * | 1/2003 | Kawashima | 355/67 |
| 2008/0259305 | A1 * | 10/2008 | Goto | 355/67 |
| 2009/0033904 | A1 * | 2/2009 | Kawashima et al. | 355/67 |

* cited by examiner

*Primary Examiner* — Hung Henry Nguyen
*Assistant Examiner* — Steven H Whitesell Gordon
(74) *Attorney, Agent, or Firm* — Canon U.S.A., Inc., IP Division

(57) ABSTRACT

An immersion exposure apparatus including an optical element 11, a reflective surface 42, a water repellent coating layer 43 in which peeled areas 45 and 46 are formed, a light intensity sensor 4 which detects light intensity of first light and second light, and an arithmetic processing unit which calculates a reflectance of the optical element 11, wherein the first light enters the projection optical system 1, passes through the peeled area 46 to be reflected by the reflective surface 42, is reflected on a surface of the optical element 11, and passes through the peeled area 45 to be received by the light intensity sensor 4, and the second light enters the projection optical system 1 and passes through the peeled area 45 to be received by the light intensity sensor 4 without being reflected on the reflective surface 42 and the surface of the optical element 11.

9 Claims, 10 Drawing Sheets

IMMERSION EXPOSURE APPARATUS AND DEVICE MANUFACTURING METHOD

BACKGROUND OF THE INVENTION

1. Field of the Invention

The present invention relates to an immersion exposure apparatus which is capable of measuring reflectance of an optical element constituting a projection optical system and a device manufacturing method using thereof.

2. Description of the Related Art

In a manufacturing process of semiconductor devices constituted by fine patterns such as a ULSI, a reduced projection exposure apparatus which performs a reduced projection of a pattern formed on an original plate onto a substrate on which a photosensitizing agent is applied so as to transfer it is used. In accordance with the improvement of the integration density in semiconductor devices, further miniaturization of the pattern is required, and an exposure apparatus has responded to the miniaturization as well as the development of resist processes.

In order to improve the resolution of the exposure apparatus, generally, there are a method for shortening an exposure wavelength and a method for enlarging numerical aperture (NA) of a projection optical system.

In order to enlarge the numerical aperture (NA), a projection exposure apparatus using an immersion method has been proposed in the past. Conventionally, the space between a final surface of a projection optical system and a substrate to be exposed (for example, a wafer) was filled with gas. In contrast, according to the immersion method, this space is filled with liquid in order to perform a projection exposure.

The advantage of the immersion method is to improve the resolution compared to the conventional method even if a light source that has the same wavelength as that of conventional one is used. For example, in a case where the liquid that is filled with the space between the projection optical system and the substrate is pure water (the refractive index is 1.44), when a maximum incident angle of a light beam that forms an image on a substrate is assumed to be equal between the immersion method and the conventional one, the resolution of the immersion method improves 1.44 times as much as the conventional one. This is equivalent to increasing the numerical aperture NA 1.44 times as much as the projection optical system of the conventional method. Thus, the immersion method enables to obtain the resolution more than NA=1, which was conventionally impossible.

Japanese Patent Laid-Open No. 2005-116570 discloses an immersion exposure apparatus in which a light receiving unit is placed on a substrate stage. This immersion exposure apparatus exposes a substrate by irradiating exposure light for the substrate (wafer) placed on a image surface of a projection optical system via the projection optical system and liquid.

The exposure apparatus disclosed in Japanese Patent Laid-Open No. 2005-116570 includes the light receiving unit which receives light that has passed through the projection optical system via a slit opening placed on an image surface of the projection optical system, and a temperature sensor which detects temperature information of the liquid filled between the projection optical system and the slit opening. Based on the result detected by the light receiving unit and the result measured by the temperature sensor, performance information including an imaging performance is calculated and this information is reflected at the time of exposure.

Japanese Patent Laid-Open No. 2005-191557 discloses that a plan plane having a water repellent flat surface at the substantially same height as that of the substrate (the wafer) on a substrate stage is provided and that the plan plane is configured to be exchangeable. Further, Japanese Patent Laid-Open No. 2005-191557 discloses that the surface of the reference member that is placed on the substrate stage and that has a reference mark also has water repellent properties and that the reference member is exchangeable. It also discloses that polytetrafluoroethylene is used as a material that has water repellent properties.

FIG. 9 is a plan view showing a configuration example of a wafer stage 5.

At a periphery outside the wafer 51, a wafer stage upper surface cover 47 and a light intensity sensor 4 are placed. In the immersion exposure apparatus, an immersion area 70 is larger than an exposure area (not shown). The wetted area 71 is larger than the immersion area 70. The wetted area 71 is an area which contacts liquid by the movement of the immersion area 70 in accordance with the exposure operation. A light intensity sensor 4 for controlling the exposure amount may be included in the wetted area 71.

The wafer 51, the water stage upper surface cover 47, and the light intensity sensor 4 are configured so that the heights of the surfaces which contact the liquid are the same one another. In this case, a water repellent process of the wetted surface is necessary. When the wafer stage 5 is driven in a state where the liquid remains, the residual liquid is splashed. It may causes the change of the environment inside the exposure apparatus (for example, rust is generated) or the generation of an electric fault.

A photoresist for immersion exposure (not shown) is applied on the wafer 51. This photoresist layer has water repellent properties. The water repellent process is performed on the wetted surface of the wafer stage upper surface cover 47 and the wetted surface of the light intensity sensor 4.

As described above, Japanese Patent Laid-Open No. 2005-191557 discloses that the reference member (a substrate reference plate) which has the reference mark to be irradiated by light has water repellent properties, the reference member is exchanged at the time of the deterioration of the water repellent properties, and polytetrafluoroethylene is used as a material having water repellent properties.

However, when an excimer laser light, particularly ArF excimer laser light, is irradiated on polytetrafluoroethylene, the water repellent properties are deteriorated and contaminants are generated. Therefore, the contaminants adhere to the wetted surface of the optical element which constitutes the projection optical system, and it may causes the generation of a defect at the time of exposing a wafer.

BRIEF SUMMARY OF THE INVENTION

The present invention provides an immersion exposure apparatus which is capable of measuring the reflectance of the optical element constituting the projection optical system with a simple configuration. Furthermore, the present invention provides a device manufacturing method using the immersion exposure apparatus.

An immersion exposure apparatus as one aspect of the present invention is configured to expose a substrate via liquid between a projection optical system and the substrate. The immersion exposure apparatus includes an optical element constituting a part of the projection optical system, a reflective member configured to reflect light to the projection optical system, a water repellent member in which at least one opening is formed, a light intensity detecting unit configured to detect light intensity of first light and second light, and an arithmetic processing unit configured to calculate a reflectance of the optical element based on the light intensity of the first light and the second light. The first light is light which enters the projection optical system, passes through one of the at least one opening of the water repellent member to be reflected by the reflective member, is reflected on a surface of the optical element, and passes through one of the at least one opening to be received by the light intensity detecting unit. The second light is light which enters the projection optical system, and passes through one of the at least one opening of the water repellent member to be received by the light intensity detecting unit without being reflected on the reflective member and the surface of the optical element.

An immersion exposure apparatus as another aspect of the present invention is configured to expose a substrate via liquid between a projection optical system and the substrate. The immersion exposure apparatus includes an optical element constituting a part of the projection optical system, a reflective member configured to reflect light to the projection optical system, a water repellent member in which at least one opening is formed, a light intensity detecting unit configured to detect light intensity of first light and second light, and an arithmetic processing unit configured to calculate a reflectance of the optical element based on the light intensity of the first light and the second light. The first light is light which is reflected on a surface of the optical element and the reflective member, enters the projection optical system, and passes through one of the at least one opening of the water repellent member to be received by the light intensity detecting unit. The second light is light which enters the projection optical system and passes through one of the at least one opening of the water repellent member to be received by the light intensity detecting unit without being reflected on the surface of the optical element and the reflective member.

A device manufacturing method as another aspect of the present invention includes the steps of exposing a substrate using the exposure apparatus and developing the exposed substrate.

Further features and aspects of the present invention will become apparent from the following description of exemplary embodiments with reference to the attached drawings.

DETAILED DESCRIPTION OF THE PREFERRED EMBODIMENTS

Figure 1:
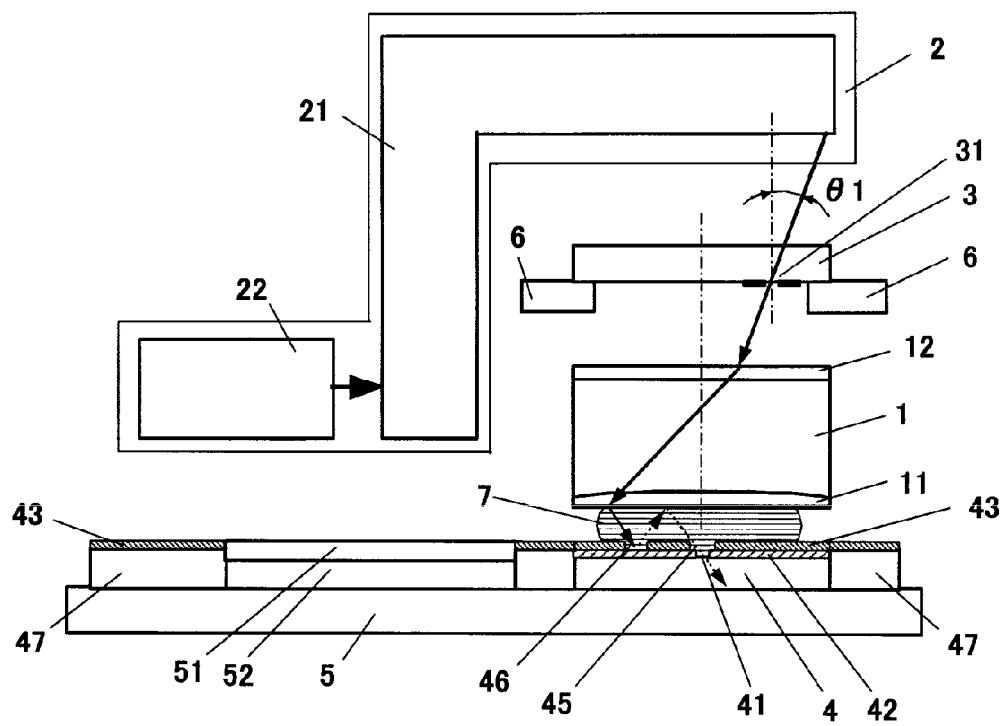
FIG. 1 is a schematic configuration diagram of an exposure apparatus in a first embodiment of the present invention.

Exemplary embodiments of the present invention will be described below with reference to the accompanied drawings. In each of the drawings, the same elements will be denoted by the same reference numerals and the duplicate descriptions thereof will be omitted.

First Embodiment

Initially, a first embodiment of the present invention will be described.

FIG. 1 is a schematic configuration diagram of an immersion exposure apparatus in the first embodiment of the present invention. The immersion exposure apparatus in the present embodiment is an immersion exposure apparatus which exposes a wafer 51 (a substrate) via liquid 7 between a projection optical system 1 and the wafer 51. In other words, the immersion exposure apparatus projects a pattern formed on a reticle 3 (an original plate) onto the wafer 51 (the substrate) via the projection optical system 1 and the liquid 7. Although the immersion exposure apparatus shown in FIG. 1 is constituted as a scanning exposure apparatus (a scanner), the present embodiment is not limited to this but the immersion exposure apparatus can also be constituted as a stepper.

In FIG. 1, reference numeral 2 denotes an illumination system. The illumination system 2 includes a light source 22 such as a laser and an illumination optical system 21. Light from the light source 22 is controlled by the illumination optical system 21 so as to be a desired illumination mode (an effective light source shape), a desired polarization state, and a desired illuminance distribution, and it illuminates the reticle 3 which is placed on a reticle stage 6.

Inside the illumination optical system 21, a masking blade (not shown) whose opening is variable is provided at an optically conjugated position with respect to the reticle surface. The masking blade can change the size of the opening so as to set an illumination range on the reticle 3 to a desired area. An exposure amount sensor (not shown) for controlling the exposure amount of the illumination system 2 is provided inside the illumination optical system 21.

A pattern is formed on a lower surface of the reticle 3. Diffracted light from this pattern passes through the projection optical system 1 and forms an image on the wafer 51 which is placed on the wafer stage 5. A resist is applied on the wafer. Therefore, the pattern of the reticle 3 is transferred.

Typically, the projection optical system 1 used for an exposure apparatus is an optical system in which at least one of an object surface side and an image surface side is telecentric.

In particular, when the focus adjustment is performed by changing the height of the wafer 51, the change of the image magnification can be eliminated in principle if the image surface side is telecentric.

An optical element which is provided inside the projection optical system 1 and constitutes a part of the projection optical system 1 is purged by gas such as clean dry air or inert gas which does not contain contaminants. Therefore, the surface of the optical element which is provided inside the projection optical system 1 is not easily polluted.

However, an outermost surface of the optical element positioned at the object surface side of the projection optical system 1 (an upper surface of a reticle side optical element 12) contacts a space in which a reticle stage 6 that is a drive mechanism exists. In the atmosphere where the drive mechanism (the reticle stage 6) exists, contaminants can not be completely eliminated. Therefore, the outermost surface of the optical element which is positioned at the object surface side of the projection optical system 1 is easily influenced by the contaminants.

Further, an outermost surface of the optical element positioned at the image surface side of the projection optical system 1 (a lower surface of a wafer side optical element 11) contacts the liquid 7. At the time of exposure, the liquid 7 contacts the wafer 51 on which a resist is applied. Therefore, the outermost surface of the optical element positioned at the image surface side of the projection optical system 1 is easily influenced by the contaminants generated by the resist.

For the reasons above, each of the optical element positioned at the object surface side of the projection optical system 1 (the reticle side optical element 12) and the optical element positioned at the image surface side (the wafer side optical element 11) is constituted so as to be exchangeable if necessary.

Each of the reticle 3 and the wafer 51 is carried in and out of the exposure apparatus by a reticle transfer system and a wafer transfer system (not shown), respectively. The reticle 3 transferred by the reticle transfer system is absorbed and fixed on the reticle stage 6. The wafer 51 transferred by the wafer transfer system is absorbed and fixed on a wafer chuck 52 which is provided on the wafer stage 5.

The reticle stage 6 is driven by a reticle stage drive unit (not shown) in a scanning direction (a vertical direction with respect to the plane of the paper in FIG. 1). The wafer stage 5 is driven by a wafer stage drive unit (not shown) in the scanning direction and in a direction orthogonal to the scanning direction. Since the exposure apparatus of the present embodiment is a scanning semiconductor exposure apparatus, the pattern is transferred by synchronously scanning the reticle stage 6 and the wafer stage 5. The synchronous scanning is performed by a controller (not shown) controlling the reticle stage drive unit and the wafer stage drive unit.

The wafer stage 5 focuses the surface of the wafer 51 on the best imaging surface of the projection optical system 1 by an auto focus mechanism (not shown). Therefore, the wafer stage 5 is capable of leveling drive of the horizontal surface and is movable in an optical axis direction of the projection optical system 1 (an upper and lower direction in FIG. 1).

A light intensity sensor 4 at the wafer side (a light intensity detecting unit) is positioned on the wafer stage 5. A reflective surface 42 (a reflective member) which reflects light to the projection optical system 1 is formed on the light intensity sensor 4. A light receiving opening 41 on which the reflective surface 42 is not formed is provided on a part of the light intensity sensor 4. The wafer 51, the wafer stage upper surface cover 47, and the light intensity sensor 4 (the reflective surface 42) are constituted so that the heights of their surfaces which contacts the liquid 7 (wetted surfaces) are substantially equal to one another.

A water repellent coating layer 43 (a water repellent member) is formed on the wetted surface of the wafer stage upper surface cover 47 and the wetted surface of the light intensity sensor 4 (the reflective surface 42). The water repellent layer 43 is treated with a water repellent process for repelling the liquid 7, and the water repellent coating layer 43 is provided at the wafer stage 5.

A liquid supply unit and a liquid recovery unit (not shown) are positioned over the wafer 51 and at the image surface side of the projection optical system 1. The liquid supply unit includes a liquid supply pipe, a pump, a temperature regulator, a filter, and the like, and supplies the liquid 7 to a space between the wafer side optical element 11 of the projection optical system 1 and the wafer 51. The liquid recovery unit includes a liquid recovery pipe, a pump, and a gas-liquid separator, and recovers the liquid 7 supplied to the space between the wafer side optical element 11 and the wafer 51. The liquid supply unit and the liquid recovery unit are controlled by a main control system (not shown).

Next, the reflectance measurement of the wafer side optical element 11 of the projection optical system 1 in the present embodiment will be described.

Figure 2:
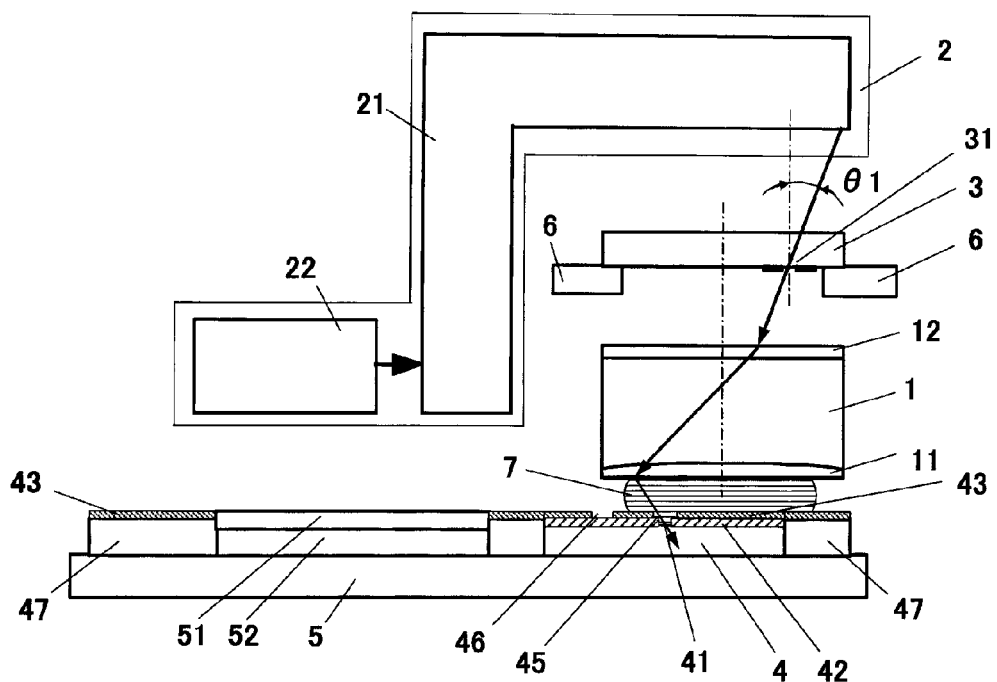
FIG. 2 is a schematic configuration diagram of an exposure apparatus in a first embodiment of the present invention.

The present embodiment measures a light intensity measurement value of an exposure amount sensor (not shown) which is constituted in the illumination system 2 and a light intensity measurement value of the light intensity sensor 4 which is constituted on the wafer stage 5 in each of the states shown in FIGS. 1 and 2. The reflectance of the wafer side optical element 11 of the projection optical system 1 is calculated based on these measured light intensity measurement value.

First, the measurement of the light in a state shown in FIG. 1 will be described. FIG. 1 shows an appearance where the light entering the projection optical system 1 is reflected on the reflective surface 42 and the surface of the wafer side optical element 11 and enters the light receiving opening 41. The light shown in FIG. 1 is defined as first light.

The light emitted from the light source 22 of the illumination system 2 becomes a monopole obliquely incident light beam which has an incident angle $\theta 1$ with respect to a direction orthogonal to the surface of the reticle 3 by an illumination optical system 21, and illuminates a light transmissive opening pattern 31 which is formed on the reticle 3.

The monopole obliquely incident light beam can be formed by providing an aperture at a position that is an optically pupil surface with respect to the surface of the reticle 3 in the illumination system 2. However, instead of this, if for example an effective light source of around $\sigma=0.1$ is formed using a diffractive optical element such as CGH (a computer-generated hologram), an obliquely incident light beam having light intensity with dozens of times higher illuminance can be formed. Thus, the aperture or the diffractive optical element provided inside the illumination optical system 21 is an optical shaping unit which shapes light so that the light from the light source 22 obliquely enters the projection optical system 1 at a predetermined incident angle.

A peeled area 45 (a second opening) and a peeled area 46 (a first opening) are areas where the water repellent coating layer 43 which is formed on the surface of the light intensity sensor 4 (the reflective surface 42) is peeled. Thus, the water repellent coating layer 43 has openings (the peeled areas 45 and 46) which are formed by partially peeling the water repellent coating. The water repellent coating layer 43 generates contaminants by irradiating exposure light. Therefore, it is necessary to form the peeled areas 45 and 46 so as to prevent the generation of the contaminants from the water repellent coating layer 43.

The light beam which passes through the light transmissive opening pattern 31 formed on the reticle 3 passes through the projection optical system 1 and the liquid 7 and enters the peeled area 46. The light condensed by the peeled area 46 is reflected by the reflective surface 42.

The light beam which enters the peeled area 46 and is reflected by the reflective surface 42 is reflected on the surface of the wafer side optical element 11 that is an immersion surface of the projection optical system 1. The light reflected on the surface of the wafer side optical element 11 enters the peeled area 45. The light that has entered the peeled area 45 passes through the light receiving opening 41 which is provided under the peeled area, and it is received and photoelectrically converted by the light intensity sensor 4.

In this case, the wafer stage 5 is driven to the position which is calculated in advance so that the obliquely incident light beam enters the light receiving opening 41. The position where the obliquely incident light beam enters the light receiving opening 41 can be automatically calculated using a computer in the projection exposure apparatus.

Figure 10:
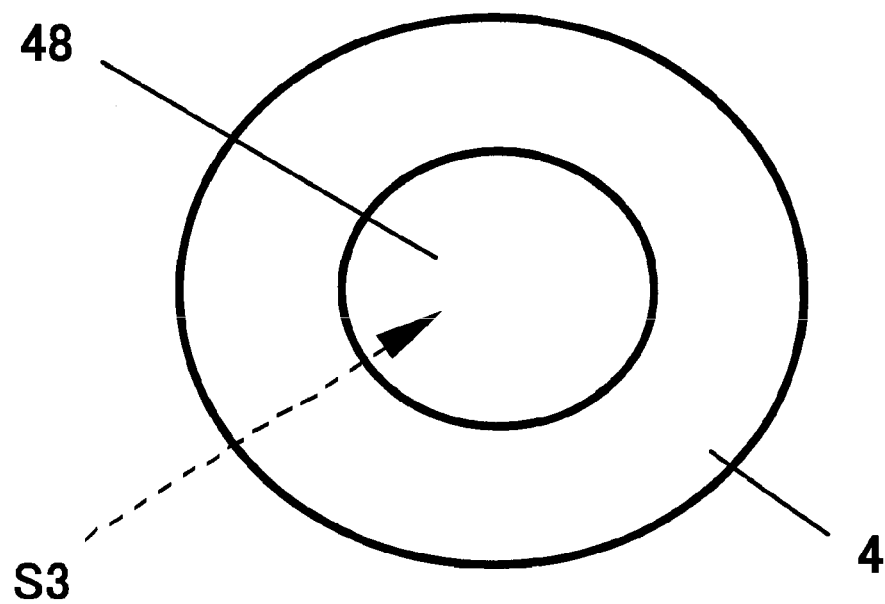
FIG. 10 is a plan view showing a position relation between a peeled area of a water repellent coating layer and a light intensity sensor.
Figure 11:
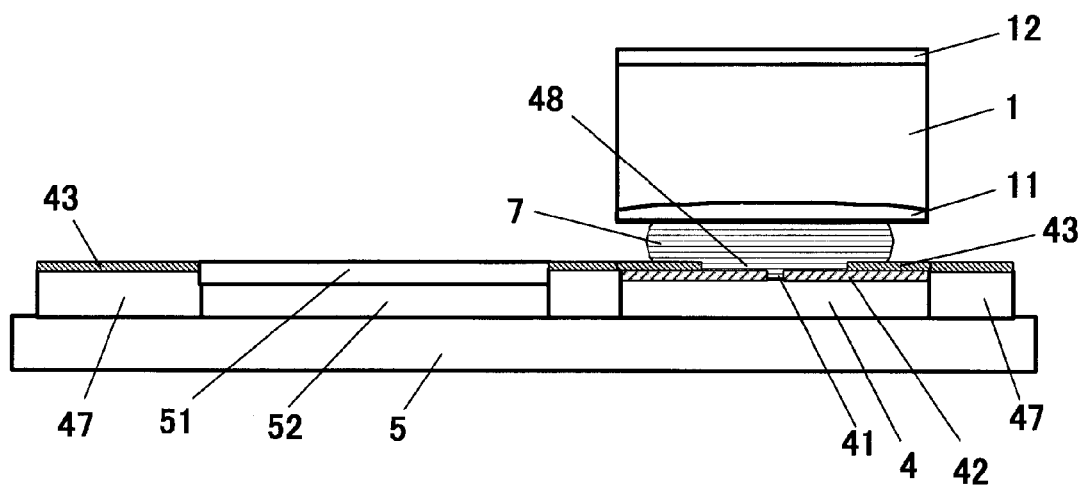
FIG. 11 is a view showing a state where a light intensity sensor is positioned under a projection optical system.
Figure 12:
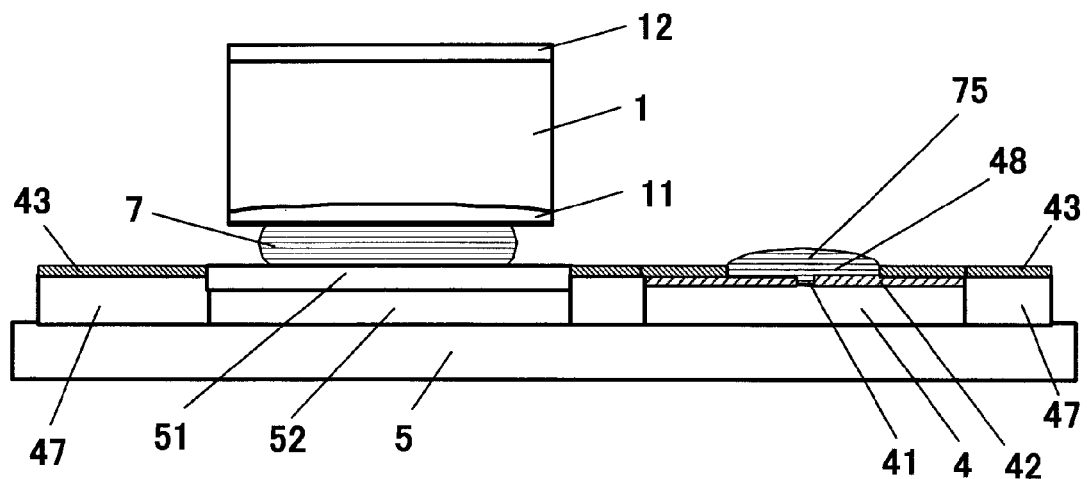
FIG. 12 is a view showing a state where a wafer is positioned under a projection optical system.

Next, the size of the peeled areas 45 and 46 of the water repellent coating layer 43 will be described. FIGS. 10 to 12 show a peeled area 48 which has a size including at least the peeled areas 45 and 46 shown in FIG. 1.

FIG. 10 is a plan view showing a position relation between the peeled area 48 of the water repellent coating layer 43 and the light intensity sensor 4. In the embodiment, the area of the peeled area 48 is defined as S3.

FIG. 11 shows a state where the light intensity sensor 4 is positioned under the wafer side optical element 11 of the projection optical system 1 and is in contact with the liquid 7. FIG. 12 shows a state where the wafer stage 5 moves from the state of FIG. 11 and the wafer 51 is positioned under the wafer side optical element 11 of the projection optical system 1 and is in contact with the liquid 7.

As shown in FIG. 11, when the light intensity sensor 4 is positioned under the projection optical system 1, the liquid 7 (water that is an immersion material) adheres to the peeled area 48. Whether or not the liquid 7 remains on the peeled area 48 is determined by the relation between hydrophilic property of the peeled area 48 (a force to remain the liquid 7 on the surface) and the surface tension of the liquid 7 under the projection optical system 1 (a force to converge the liquid so as not to separate).

As the area S3 of the peeled area 48 is large, the adhesion remainder of the liquid 7 is easily generated. When the wafer stage 5 is accelerated (driven) to move from the state shown in FIG. 11 (the resting state) to the state shown in FIG. 12, the adhesion remainder 75 of the liquid 7 is easily generated as the acceleration of the wafer stage 5 is large. When the wafer stage 5 moves at a constant velocity and the liquid 7 under the projection optical system 1 passes through over the light intensity sensor 4, the adhesion remainder 75 of the liquid 7 is easily generated as the passing velocity of the wafer stage 5 is large.

When pure water is used as an immersion material that is the liquid 7, it is preferable that the thickness of the liquid 7 under the projection optical system 1 (the distance between the lower surface of the wafer side optical element 11 of the projection optical system 1 and the upper surface of the wafer 51) sets to around a few mm. In the exposure apparatus in which the thickness of the liquid 7 (pure water) is around a few mm, in a condition that two hundred wafers 51 having the diameter of 300 mm is exposed per hour (the moving velocity and the acceleration of the wafer stage 5), for example when the area S3 of the peeled area 48 is beyond 20 $mm^2$, the adhesion remainder 75 of the liquid 7 is generated.

Figure 3:
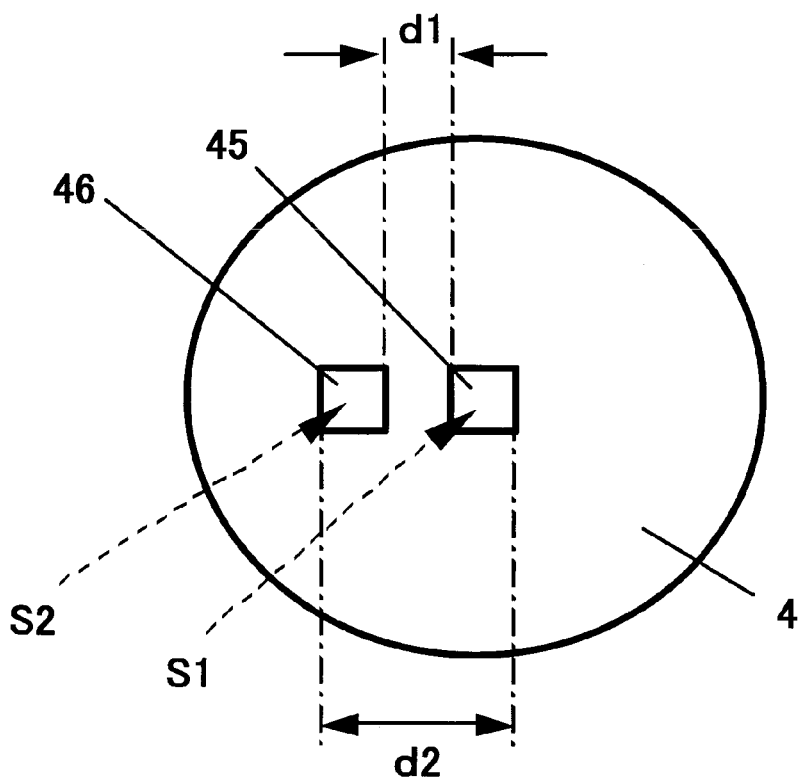
FIG. 3 is a plan view showing a position relation between a peeled area of a water repellent coating layer and a light intensity sensor in first and second embodiments of the present invention.

FIG. 3 is a plan view showing a position relation between the peeled area 45 (the second opening) and the peeled area 46 (the first opening) of the water repellent coating layer 43 shown in FIG. 1 and the light intensity sensor 4.

As shown in FIG. 3, the opening (the peeled area) of the water repellent coating layer 43 in the present embodiment includes the first opening (the peeled area 46) and the second opening (the peeled area 45). In the embodiment, the areas of the peeled areas 45 and 46 are defined as S1 and S2, respectively. Although the shape of the peeled area shown in FIG. 3 is a rectangular opening, the present embodiment is not limited to this. The peeled area may have for example a polygonal shape, a round shape, or an elliptical shape.

In the case where a plurality of the peeled areas 45 and 46 are closely positioned each other, for example, even if each of the area S1 of the peeled area 45 and the area S2 of the peeled area 46 is equal to or less than 20 $mm^2$, when the position distance between the peeled areas 45 and 46 is smaller than a predetermined value, the adhesion reminder of the liquid is generated.

Figure 4:
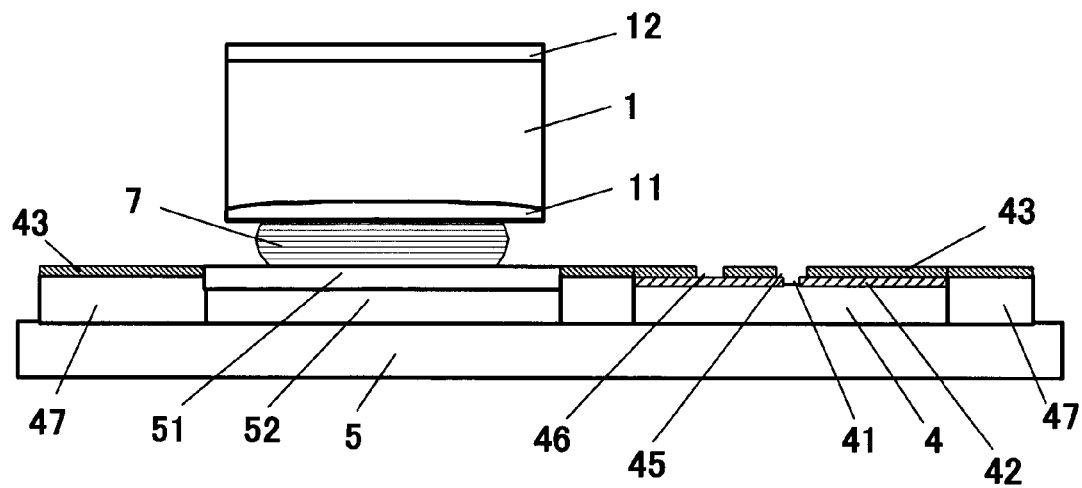
FIG. 4 is a schematic configuration diagram of an exposure apparatus in a first embodiment of the present invention.

In the case where the distance d1 between the peeled areas 45 and 46 is equal to or less than 10 mm, for example, if the sum of the areas of the peeled areas 45 and 46 is equal to or less than 20 $mm^2$, the adhesion remainder of the liquid 7 is not generated in any condition where the wafer stage 5 moves from the state of FIG. 1 to the state of FIG. 4.

If the distance d1 of the peeled areas 45 and 46 is larger than 10 mm, each of the peeled areas 45 and 46 shows such a behavior that it exists singularly. In this case, if each of the areas S1 and S2 of the peeled areas 45 and 46 is equal to or less than 20 $mm^2$, the adhesion reminder of the liquid 7 is not generated.

As the water repellent coating layer 43, a coating layer formed by coating and drying aqueous emulsions containing a fluorocarbon silane hydrolysate can be used. If the water repellent coating layer 43 is formed by the coating layer, it is capable of coating the surface in a thin film state of the thickness of around 20 to 30 nm, and the flatness similar to the base material flatness can be ensured.

The reflective surface 42 and the light receiving opening 41 on the light intensity sensor 4 are generally formed by patterning a light shielding film containing metal such as Cr (chromium) or Ta (tantalum) on the surface of a transmissive substrate, for example. Furthermore, the light shielding film containing metal can also be protected from pure water that is the immersion material (it acts as a weak acid) by coating a dielectric film on the metal film. Thus, the dielectric film prevents the light shielding film from changing the optical properties such as the transmittance or the reflectance due to the change such as oxidation.

Subsequently, the measurement of the light in a state shown FIG. 1 will be quantitatively described.

In a state shown in FIG. 1, the measurement of the light intensity is performed at the same time by an exposure amount sensor (not shown) provided inside the illumination system 2 and the light intensity sensor 4 placed on the wafer stage 5. In this case, the light intensity which is measured by the exposure amount sensor provided inside the illumination system 2 is defined as IN(1), and the light intensity measured by the light amount sensor 4 is defined as OUT(1).

The illuminance of the light beam illuminating the reticle 3 is represented as K·IN(1) which is obtained by multiplying the measurement efficiency K determined in accordance with the position of the exposure amount sensor in the illumination system 2 by the light intensity IN(1) measured by the exposure amount sensor (not shown) provided inside the illumination system 2.

The illuminance of the light beam immediately after passing through the light transmissive opening pattern 31 is represented as K·IN(1)·GT(2) when the glass surface transmittance of the reticle 3 is defined as GT.

The imaging magnification of the projection optical system 1 installed in an exposure apparatus is generally a reduced magnification such as ¼ or ⅕. However, in this case, for easy understanding, the imaging magnification of the projection optical system 1 is regarded as 1. The case where the reduced magnification is 1/β is apparent and the description thereof is omitted.

The illuminance of the light beam condensed on the reflective surface 42 on the light intensity sensor 4 is represented as K·IN(1)·GT2·PT when the transmittance of the projection optical system 1 is defined as PT. The illuminance of the light beam irradiating the light receiving opening 41 is represented as K·IN(1)·GT2·PT·WR·ULDR when the surface reflectance of the reflective surface 42 is defined as WR and the surface reflectance of the wafer side optical element 11 is defined as ULDR. The illuminance of the light beam immediately after passing through the light receiving opening 41 is represented as K·IN(1)·GT2·PT·WR·ULDR·WT when the transmittance of the light receiving opening 41 is defined as WT.

Furthermore, it is considered that the light beam passing through the light receiving opening 41 is photo-electrically converted by the light intensity sensor 4. When the efficiency of the photoelectric conversion of the light intensity sensor 4 is defined as WK, the light intensity OUT(1) measured by the light intensity sensor 4 is represented as expression 1.

$$OUT(1)=K·IN(1)·GT2·PT·WR·ULDR·WT·WK \quad (1)$$

Next, the measurement of the light in a state shown in FIG. 2 will be described. FIG. 2 shows an appearance where the light entering the projection optical system 1 directly enters the light receiving opening 41 without being reflected on any of the reflective surface 42 and the surface of the wafer side optical element 11. In the embodiment, the light shown in FIG. 2 is defined as second light. The description of the same elements as those in FIG. 1 is omitted.

The light shown in FIG. 2 differs from that shown in FIG. 1 in that the light beam passing through the light transmissive opening pattern 31 is directly condensed on the light receiving opening 41 of the light intensity sensor 4 by the projection optical system 1 and it passes through the light receiving opening 41. Hereinafter, the measurement of the light shown in FIG. 2 will be quantitatively described.

The light intensity OUT(2) which is measured by the light intensity sensor 4 is represented as expression 2 when the light intensity which is measured by the exposure amount sensor (not shown) provided inside the illumination system 2 is defined as IN(2), $$OUT(2)=K·IN(2)·GT2·PT·WT·WK \quad (2)$$

The relational expressions obtained from the state shown in FIGS. 1 and 2 are two expressions of expressions 1 and 2. Using expressions 1 and 2, the surface reflectance ULDR of the wafer side optical element 11 is represented as expression 3.

$$ULDR=\{OUT(1)/IN(1)/OUT(2)/IN(2)\}·(1/WR) \quad (3)$$

As a result, the surface reflectance ULDR of the wafer side optical element 11 can be obtained by the following three terms [1] to [3]. In other words, they are [1] the light intensities IN(1) and IN(2) which are measured by the exposure amount sensor (not shown) provided in the illumination system, [2] the light intensities OUT(1) and OUT(2) which are measured by the light intensity sensor 4, and [3] the surface reflectance WR of the reflective surface 42 of the light intensity sensor 4.

The surface reflectance WR of the reflective surface 42 is stored in a storage unit (not shown) of the exposure apparatus in advance for example by actually measuring it before the light intensity sensor 4 is installed in the apparatus.

Figure 5:
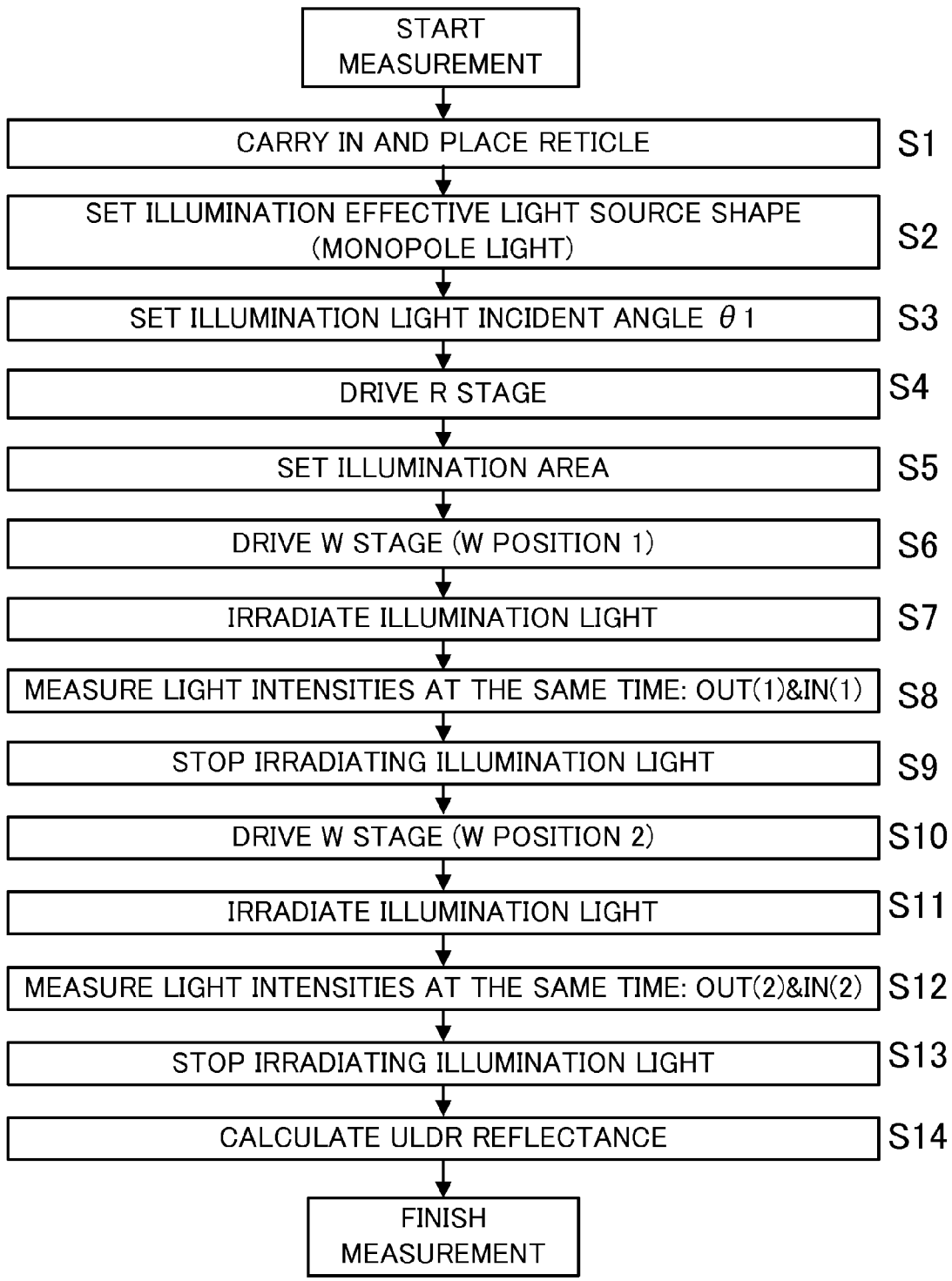
FIG. 5 is a flowchart of a measurement method in a first embodiment of the present invention.

Next, the measurement method in the present embodiment will be described. FIG. 5 is a flowchart of the measurement method in the present embodiment.

First, at step S1, the reticle 3 is carried in the exposure apparatus and is placed on the reticle stage 6. A plurality of light transmissive opening pattern 31, which correspond to a plurality of image heights respectively in the projection optical system 1, are formed on the reticle 3.

At step S2, the optical shaping unit which is provided in the illumination system 2 changes the light from the light source 22 to the monopole illumination light. At step S3, an incident angle variable unit which is provided in the illumination system 2 set the incident angle (NA) of the illumination light to a predetermined angle θ1. In the embodiment, the incident angle variable unit is for example a zoom optical system which is provided between the optical shaping unit and the reticle 3.

At step S4, the reticle stage 6 is driven so that the light transmissive opening pattern 31 matches the exposure area of the projection optical system 1. At step S5, the masking blade which is provided in the illumination system 2 is driven, and the illumination system partially illuminates only the vicinity of the light transmissive opening pattern 31 of the image height to be measured.

At step 6, the wafer stage 5 is driven so as to be a state shown in FIG. 1. In other words, the wafer stage 5 is placed at a first position (W position 1) so that the light beam which has passed through the light transmissive opening pattern 31 passes through the light receiving opening 41 of the light intensity sensor 4 after it is reflected on the reflective surface 42 and the surface of the wafer side optical element 11.

Next, at step S7, the illumination light is irradiated on the reticle 3 by oscillating a laser that is the light source 22, for example. At step S8, the light intensity IN(1) is measured by using an exposure amount sensor (not shown) which is provided in the illumination system 2, and the light intensity OUT(1) is measured by using the light intensity sensor 4 which is placed on the wafer stage 5. These measurements are performed at the same time.

At step S9, the illumination light is stopped from being irradiated on the reticle 3 by stopping oscillating the laser that is the light source 22, for example.

At step S10, the wafer stage 5 is driven so as to be a state shown in FIG. 2. In other words, the wafer stage 5 is placed at a second position (W position 2) so that the light beam which has passed through the light transmissive pattern 31 directly passes through the light receiving opening 41 of the light intensity sensor 4 without being reflected on any of the reflective surface 42 and the surface of the wafer side optical element 11.

Next, at step S11, the illumination light is irradiated on the reticle 3 by oscillating the laser that is the light source 22, for example. At step S12, the light intensity IN(2) is measured by using the exposure amount sensor (not shown) which is provided in the illumination system 2, and the light intensity OUT(2) is measured by using the light intensity sensor 4 which is placed on the wafer stage 5. These measurements are performed at the same time.

At step S13, the illumination light is stopped from being irradiated on the reticle 3 by stopping oscillating the laser that is the light source 22, for example.

At step S14, the surface reflectance ULDR of the wafer side optical element 11 is calculated based on expression 3. The surface reflectance ULDR of the wafer side optical element 11 is calculated by considering the incident angle at the time of the measurement using light intensities IN(1), OUT(1), IN(2), and OUT(2) which have been already measured and incident angle characteristic value of the surface reflectance WR of the reflective surface 42 which has been already stored in the exposure apparatus.

As shown in FIG. 1, the first light enters the projection optical system 1, passes through the peeled area 46 (the first opening) of the water repellent coating layer 43 to be reflected on the reflective surface 42, is reflected on the surface of the wafer side optical element 11, and passes through the peeled area 45 (the second opening) to be received by the light intensity sensor 4. The first light is light which is detected with the wafer stage 5 placed at the first position.

As shown in FIG. 2, the second light is light which enters the projection optical system 1 and passes through the peeled area 45 (the second opening) of the water repellent coating layer 43 to be received by the light intensity sensor 4 without being reflected on the reflective surface 42 and on the surface of the wafer side optical element 11. The second light is light which is detected with the wafer stage 5 placed at the second position differing from the first position.

The light intensity sensor 4 detects the light intensity of the first light and the second light. An arithmetic processing unit (not shown) calculates the reflectance of the wafer side optical element 11 based on the light intensity of the first light and the second light.

Second Embodiment

Next, a second embodiment of the present invention will be described.

Figure 6:
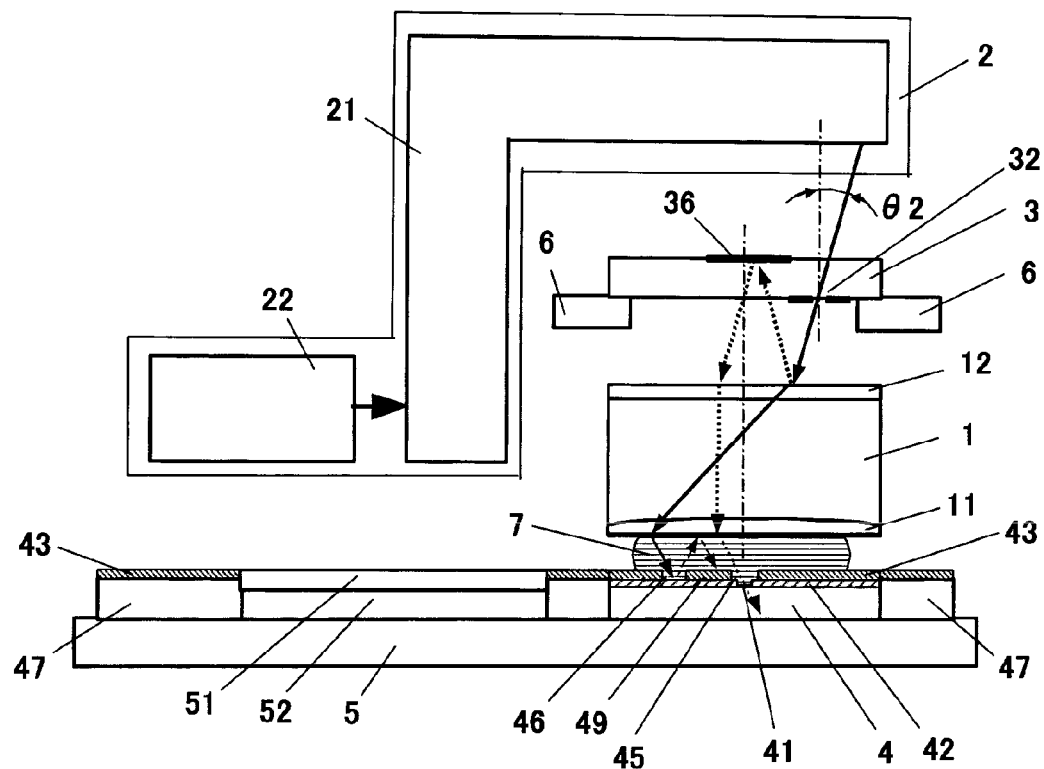
FIG. 6 is a schematic configuration diagram of an exposure apparatus in a second embodiment of the present invention.
Figure 7:
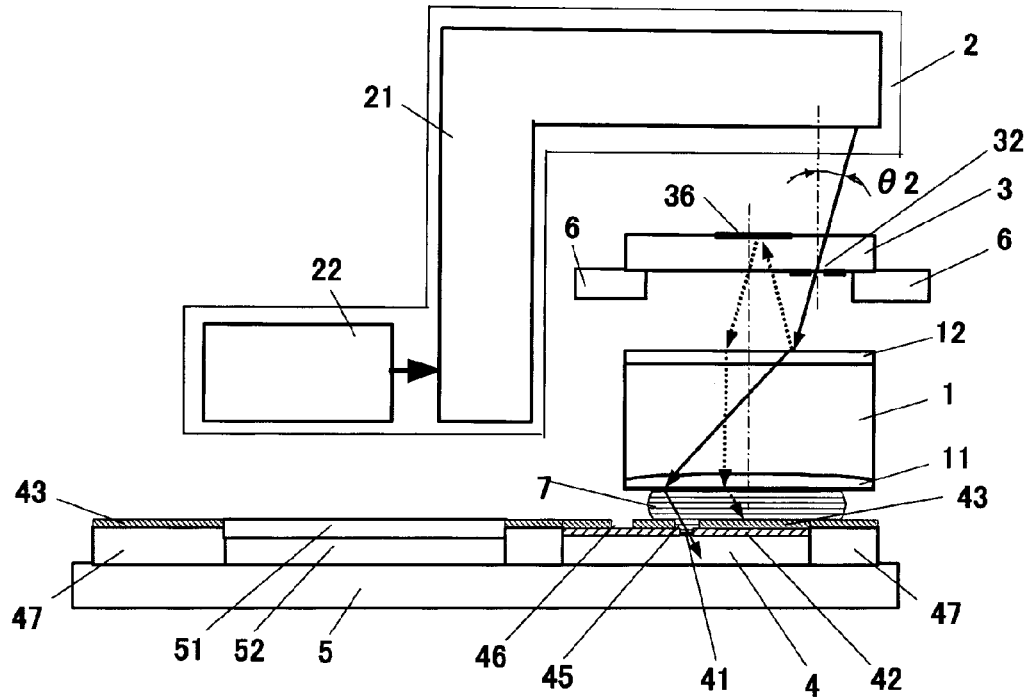
FIG. 7 is a schematic configuration diagram of an exposure apparatus in a second embodiment of the present invention.

FIGS. 6 and 7 are schematic configuration diagrams of an immersion exposure apparatus in the second embodiment of the present invention. Referring to FIGS. 6 and 7, the reflectance measurement of the reticle side optical element 12 of the projection optical system 1 in the present embodiment will be described. In the present embodiment, the size and the interval of the peeled areas 45 and 46 of the water repellent coating layer 43 of the light intensity sensor 4 which is provided on the wafer stage 5 is the same as those of the first embodiment.

First, the measurement of light (a first light) in a state shown in FIG. 6 will be described.

Light emitted from the light source 22 which is provided in the illumination system 2 is converted to a monopole obliquely incident light beam having incident angle $\theta 2$ by the illumination optical system 21 and illuminates the light transmissive opening pattern 32 which is formed on the reticle 3.

The light beam which has passed through the light transmissive opening pattern 32 is separated into a light beam which is reflected on the surface (the upper surface) of the reticle side optical element 12 of the projection optical system 1 and a light beam which transmits the reticle side optical element 12. The reticle side optical element 12 which is placed at the outermost ward of the projection optical system 1 is mostly a transmissive element such as an easily exchangeable plane parallel plate.

First, the light beam which is reflected on the surface of the reticle side optical element 12 of the projection optical system 1 will be described.

The light beam which is reflected on the surface (the upper surface) of the reticle side optical element 12 of the projection optical system 1 is reflected by the reticle upper surface reflective area 36 (a reflective member) formed on the reticle 3, and enters the projection optical system 1 again. Thus, in the present embodiment, the reticle upper surface reflective area 36 constitutes a reflective surface (a reflective member) and the reflective surface is provided on the reticle 3 (an original plate).

The light beam which has entered the projection optical system 1 passes through the peeled area 45 of the water repellent coating layer 43 which contacts the liquid 7 and is introduced to the light receiving opening 41 of the light intensity sensor 4 (the light intensity detecting unit). The light beam which has passed through the light receiving opening 41 is received and photo-electrically converted by the light intensity sensor 4.

In this case, the wafer stage 5 is driven by calculating the position in advance so that the obliquely incident light beam reflected by the reticle upper surface reflective area 36 enters the light receiving opening 41. Specifically, in a condition that the position of the light receiving opening 41 of the light intensity sensor 4 in an upper and lower direction is maintained on the image surface of the projection optical system 1, the wafer stage 5 is driven in a horizontal direction (in a plane vertical to the plane of the paper) and the incident position of the obliquely incident light beam matches the position of the light receiving opening 41. The image surface of the projection optical system 1 is a position on which the pattern formed on the lower surface of the reticle 3 forms an image at the wafer side, i.e. the upper and the lower position which is the same as that of the wafer stage 5 shown in FIG. 1.

Next, the light beam which transmits the reticle side optical element 12 of the projection optical system 1 will be described.

The light beam which passes through the light transmissive opening pattern 32 formed on the reticle 3 and directly passes through the reticle side optical element 12 of the projection optical system 1 passes through the projection optical system 1 and the liquid 7, is condensed on the peeled area 46 of the wafer stage 5, and is reflected by the reflective surface 42.

The light beam which has been reflected by the peeled area 46 contacting the liquid 7 reaches the water repellent coating layer 49 contacting the liquid 7 after it is reflected on the surface (the lower surface) of the wafer side optical element 11 that is an immersion surface of the projection optical system 1. The water repellent coating layer 49 is a part of the water repellent coating layer 43 and is positioned between the peeled areas 45 and 46.

The intensity of the light which reaches the water repellent coating layer 49 has an intensity that is a several hundredth part of that of the light condensed in the peeled area 46. Therefore, the pollution caused by the exposure light being irradiated on the water repellent coating layer 49 is extremely low, and there is no problem.

As shown in FIG. 6, the incident angle of the monopole obliquely incident light beam to the reticle 3 is set to $\theta 2$ and it differs from the incident angle $\theta 1$ in the first embodiment. Therefore, the light beam which has been reflected by the peeled area 46 contacting the liquid 7 reaches the water repellent coating layer 49 which contacts the liquid 7 and does not passes through the light receiving opening 41 of the light intensity sensor 4.

Next, the measurement of the light in a state shown in FIG. 6 will be quantitatively described.

In a state of FIG. 6, the light intensity measurement is performed by the exposure amount sensor (not shown) provided in the illumination system 2 and the light intensity sensor 4 placed on the wafer stage 5 at the same time.

In the embodiment, the light intensity measured by the exposure amount sensor (not shown) in the illumination system 2 is defined as IN(6) and the light intensity measured by the light intensity sensor 4 is defined as OUT(6). In this case, the illuminance of the light beam immediately after passing through the light transmissive opening pattern 32 is represented as K·IN(6)·GT2, which is similar to that of FIG. 1.

When the surface reflectance of the reticle side optical element 12 is defined as ULUR, and the reticle inner surface reflectance of the reticle upper surface reflective area 36 is defined as CUR, the illuminance of the light beam which irradiates the light receiving opening 41 is represented as K·IN(6)·GT2·ULUR·GT·CUR·GT·PT. Therefore, the light intensity OUT(6) which is measured by the light intensity sensor 4 is represented as expression 4.

$$OUT(6)=K\cdot IN(6)\cdot GT4\cdot ULUR\cdot CUR\cdot PT\cdot WT\cdot WK \quad (4)$$

Subsequently, the measurement of the light (the second light) in a state of FIG. 7 will be described.

This case differs from that of FIG. 6 in that the light beam which passes through the light transmissive opening pattern 32 and directly passes through the reticle side optical element 12 of the projection optical system 1 is introduced to the light receiving opening 41 of the light intensity sensor 4 in the peeled area 45. The light beam which has passed through the light receiving opening 41 is received and photo-electrically converted by the light intensity sensor 4.

On the other hand, the light beam which has been reflected on the surface of the reticle side optical element 12 of the projection optical system 1 is reflected by the reticle upper surface reflective area 36 and enters the projection optical system 1 again. The light beam which has entered the projection optical system 1 passes through the liquid 7 and reaches the water repellent coating layer 43 of the wafer stage 5.

The intensity of the light which reaches the water repellent coating layer 43 has an intensity that is a several hundredth part of that of the light condensed in the peeled area 46. Therefore, the pollution caused by the exposure light being irradiated on the water repellent coating layer 43 is extremely low, and there is no problem.

Next, the measurement of the light in a state shown in FIG. 7 will be quantitatively described.

The light intensity OUT(7) which is measured by the light intensity sensor 4 is represented as expression 5 when the light intensity which is measured by the exposure amount sensor (not shown) provided inside the illumination system 2 is defined as IN(7), $$OUT(7)=K\cdot IN(7)\cdot GT2\cdot PT\cdot WT\cdot WK \quad (5)$$

The relational expressions obtained from the state shown in FIGS. 6 and 7 are two expressions of expressions 4 and 5. Using expressions 4 and 5, the surface reflectance ULDR of the reticle side optical element 12 is represented as expression 6.

$$ULDR=\{OUT(6)/IN(6)/OUT(7)/IN(7)\}\cdot\{1/(GT2\cdot CUR)\} \quad (6)$$

The glass surface transmittance GT and the relation between the reticle inner surface reflectance CUR and the incident angle of the measurement light can be actually measured by using the reticle 3 alone so as to be stored in the exposure apparatus in advance. In this case, the glass surface transmittance GT and the relation between the reticle inner surface reflectance CUR and the incident angle of the measurement light may be obtained by using the optical properties of the glass material of the reticle 3 and the reticle upper surface reflective area 36 and by performing the calculation in the exposure apparatus.

Next, the measurement method in the present embodiment will be described.

Figure 8:
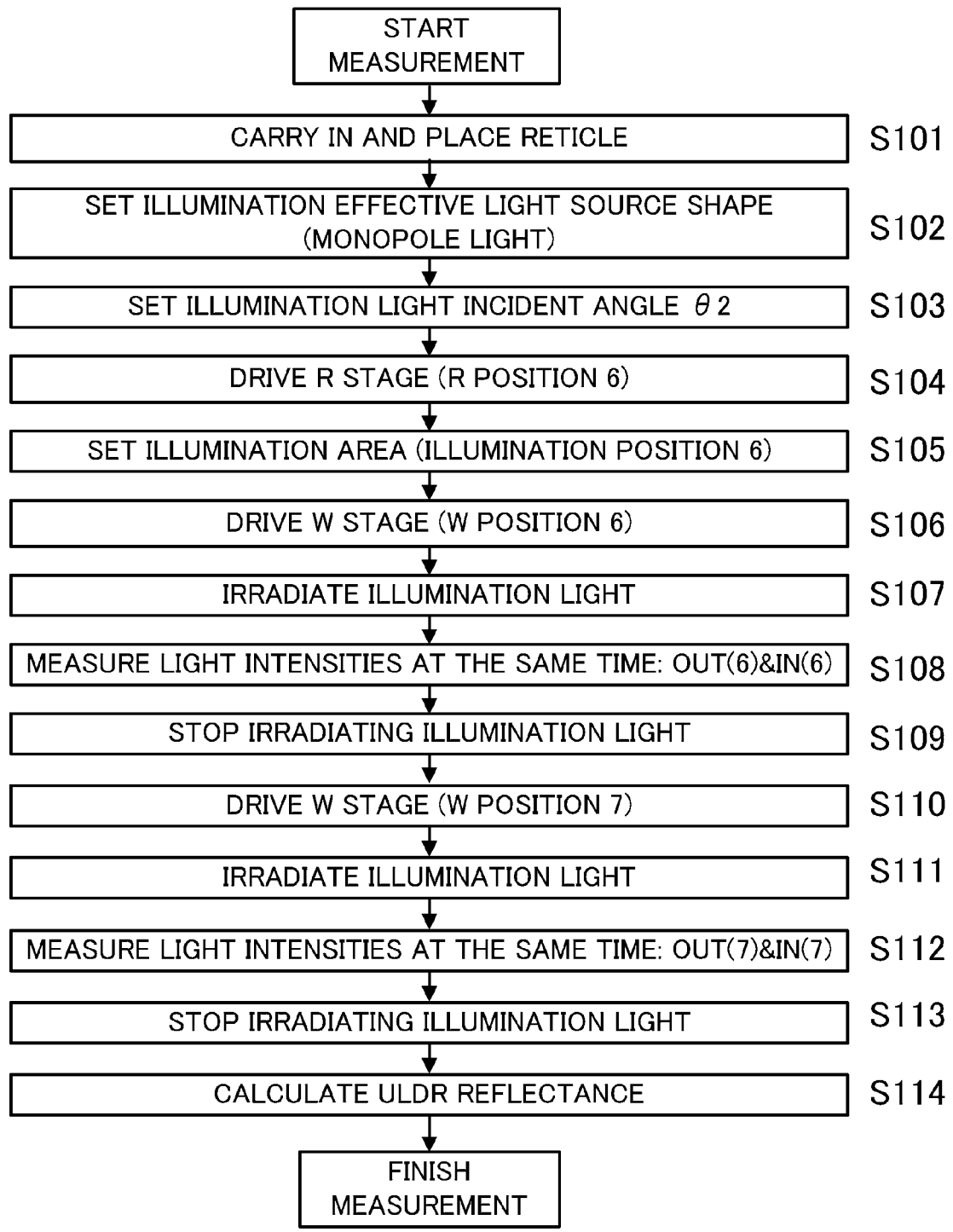
FIG. 8 is a flowchart of an exposure apparatus in a second embodiment of the present invention.
Figure 9:
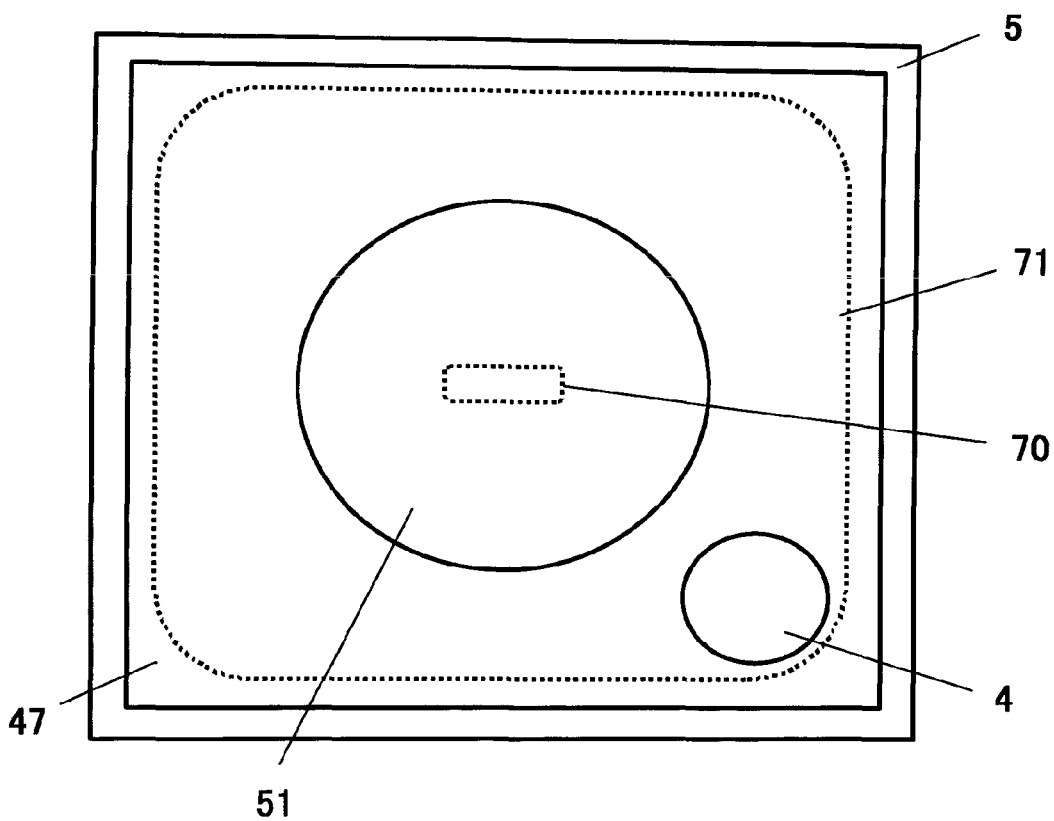
FIG. 9 is a plan view showing a configuration example of a wafer stage.

In the present embodiment, basically, the same measurement method as that of the first embodiment shown in FIG. 5 is used. FIG. 8 is a flowchart of the measurement method in the present embodiment. In the embodiment, only the points different from those of the first embodiment will be described and the descriptions of the same elements as those of the first embodiment will be omitted.

Steps S101, S102, S107, S109, S111, S113, and S114 are the same as steps S1, S2, S7, S9, S11, S13, and S14 of FIG. 5, respectively.

At step S103, the incident angle (NA) of the illumination light is set to a predetermined angle θ2. At step S104, the reticle stage 6 is driven (R position 6) so that the light transmissive opening pattern 32 matches the exposure area of the projection optical system 1. At step S105, the illumination system partially illuminates only the vicinity of the light transmissive opening pattern 32 of the image height to be measured (irradiation position 6).

At step S106, the wafer stage 5 is driven so as to be the state shown in FIG. 6. In other words, the wafer stage 5 is placed at a third position (W position 6) so that the light beam which has passed through the light transmissive opening pattern 32 passes through the light receiving opening 41 after it is reflected on the surface of the reticle side optical element 12 and the reticle upper surface reflective area 36.

At step S108, the light intensity IN(6) is measured by using the exposure amount sensor (not shown) provided in the illumination system 2, and the light intensity OUT(6) is measured by using the light intensity sensor 4 placed on the wafer stage 5. These measurements are performed at the same time.

At step S110, the wafer stage 5 is driven so as to be the state shown in FIG. 7. In other words, the wafer stage 5 is placed at a fourth position (W position 7) so that the light beam which passes through the light transmissive opening pattern 32 and directly passes through the reticle side optical element 12 of the projection optical system 1 directly passes through the light receiving opening 41 of the light intensity sensor 4.

At step S112, the light intensity IN(7) is measured by using the exposure amount sensor (not shown) provided in the illumination system 2, and the light intensity OUT(7) is measured by using the light intensity sensor 4 placed on the wafer stage 5. These measurements are performed at the same time.

In the present embodiment, the measurement is performed by the above steps S101 to S114.

As shown in FIG. 6, the first light is light which is reflected on the surface of the reticle side optical element 12 and the reticle upper surface reflective area 36, enters the projection optical system 1, and passes through the peeled area 45 of the water repellent coating layer 43 to be received by the light intensity sensor 4. The first light is light which is detected in a state where the wafer stage 5 is placed at the third position.

As shown in FIG. 7, the second light is light which enters the projection optical system 1 and passes through the peeled area 45 of the water repellent coating layer 43 to be received by the light intensity sensor 4 without being reflected on the surface of the reticle side optical element 12 and the reticle upper surface reflective area 36. The second light is light which is detected in a state where the wafer stage 5 is placed at the fourth position differing from the third position.

The light intensity sensor 4 detects the light intensity of the first light and the second light. An arithmetic processing unit (not shown) calculates the reflectance of the wafer side optical element 11 based on the light intensity of the first light and the second light.

Third Embodiment

Next, a third embodiment of the present invention will be described.

The first and the second embodiments measure the reflectance of the wafer side optical element 11 or the reticle side optical element 12 of the projection optical system 1 using the common light intensity sensor 4 which has the peeled areas 45 and 46 of the water repellent coating layer 43. In the first embodiment, the reflectance measurement of the wafer side optical element 11 of the projection optical system 1 is performed by limiting the incident angle of the monopole obliquely incident light beam to the reticle 3 to θ1. In the second embodiment, the reflectance measurement of the reticle side optical element 12 is performed by limiting the incident angle to θ2.

On the other hand, in the third embodiment, the reflectance measurement of the wafer side optical element 11 and the reticle side optical element 12 of the projection optical system 1 can be performed without providing any limitations of the incident angle of the monopole obliquely incident light beam to the reticle 3.

Figure 13:
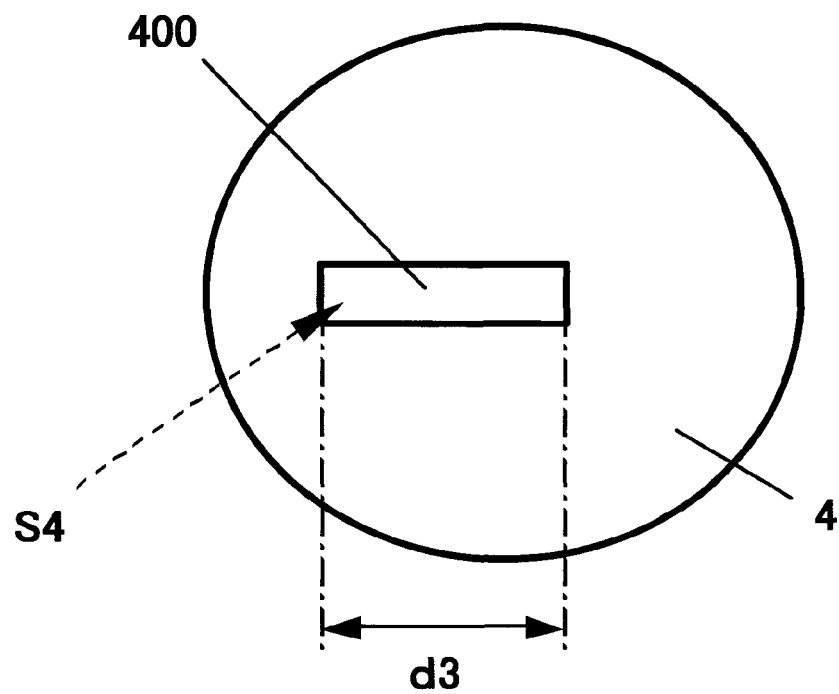
FIG. 13 is a plan view showing a position relation between a peeled area of a water repellent coating layer and a light intensity sensor in a third embodiment.

FIG. 13 is a plan view showing a position relation between the peeled area 400 of the water repellent coating layer and the light intensity sensor 4 in the third embodiment. In the present embodiment, only one rectangular peeled area 400 (an opening) is formed. The area of the peeled area 400 is S4 and the length of the long side of the rectangle is d3. Although the shape of the peeled area of FIG. 13 is a horizontally long rectangular opening, the present embodiment is not limited to this. The peeled area, for example, can have a shape of round corner rectangle or horizontally long ellipse.

In FIG. 3 showing the first and the second embodiments, the specific condition where the adhesion remainder of the liquid is not generated is, for example, d1=2 mm, S1=S2=2 mm×2 mm=4 mm$^2$, and d2=6 mm.

On the other hand, the specific condition where the adhesion remainder of the liquid is not generated in FIG. 13 is, for example, the area of the peeled area 400 is S4=18 mm$^2$, and d3=9 mm. The vertical length of the peeled area 400 (the length of the short side) is 2 mm.

The relation of d3>d2 is satisfied between the long side length d3 (specifically, for example, 9 mm) of the peeled area 400 shown in FIG. 13 and the both ends distance d2 (specifically, for example, 6 mm) of the peeled areas 45 and 46 of FIG. 3.

First, with regard to an immersion exposure apparatus which has the peeled area 400 shown in FIG. 13, the reflectance measurement of the reticle side optical element 12 in the case where the incident angle of the monopole obliquely incident light beam to the reticle 3 is set to θ1 will be described.

Figure 14:
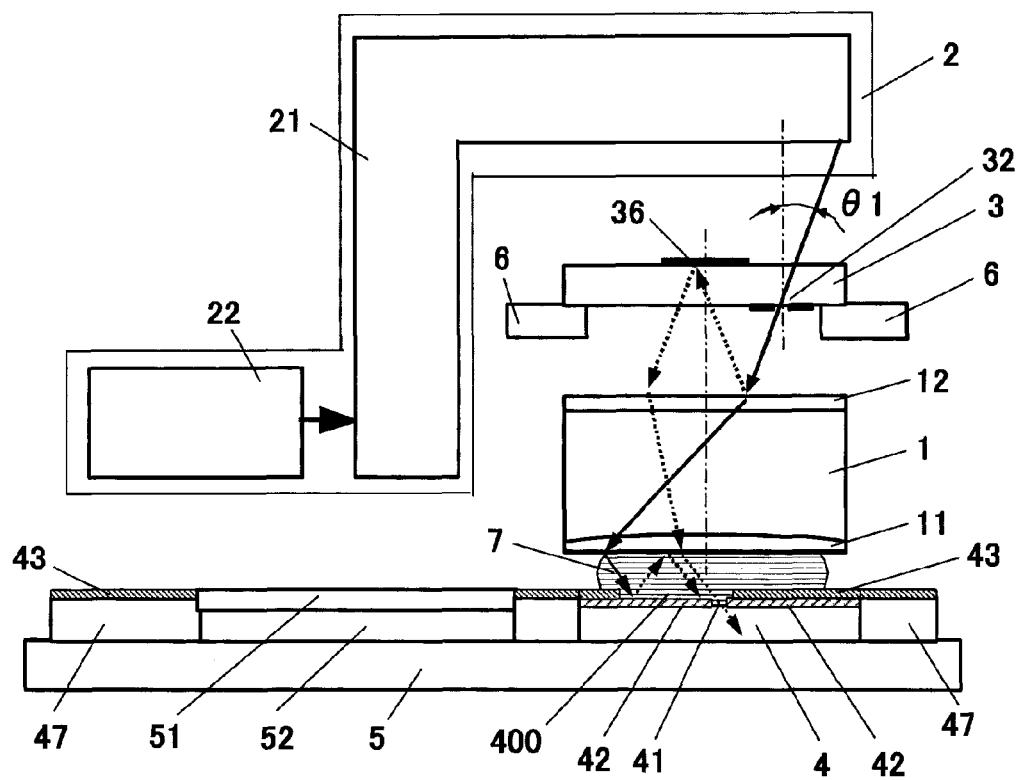
FIG. 14 is a schematic configuration diagram of an exposure apparatus in a third embodiment of the present invention.

FIG. 14 is a schematic configuration diagram of an exposure apparatus in the present embodiment. As shown in FIG. 14, the light beam which has passed through the light transmissive opening pattern 32 formed on the reticle 3 is separated into the light beam which is reflected on the surface of the reticle side optical element 12 of the projection optical system 1 and the light beam which transmits the reticle side optical element 12.

In FIG. 14, the light beam which has been reflected on the surface of the reticle side optical element 12 of the projection optical system 1 is reflected by the reticle upper surface reflective area 36 formed on the reticle 3 and enters the projection optical element 1 again. The light beam entered the projection optical system 1 is introduced to the light receiving opening 41 of the light intensity sensor 4 in the peeled area 400 of the water repellent coating layer 43 which contacts the liquid 7, and the light beam which has passed through the light receiving opening 41 is received and photo-electrically converted by the light intensity sensor 4.

On the other hand, the light beam which has transmitted through the reticle side optical element 12 is condensed on the peeled area 400 which contacts the liquid 7, via the projection optical system 1 and is reflected by the reflective surface 42. The light beam reflected by the peeled area 400 reaches the reflective surface 42 which contacts the liquid 7 again after it is reflected on the surface of the wafer side optical element 11 that is an immersion surface of the projection optical system 1. Thus, the light beam which has transmitted through the reticle side optical element 12 does not pass through the light receiving opening 41 of the light intensity sensor 4.

Figure 15:
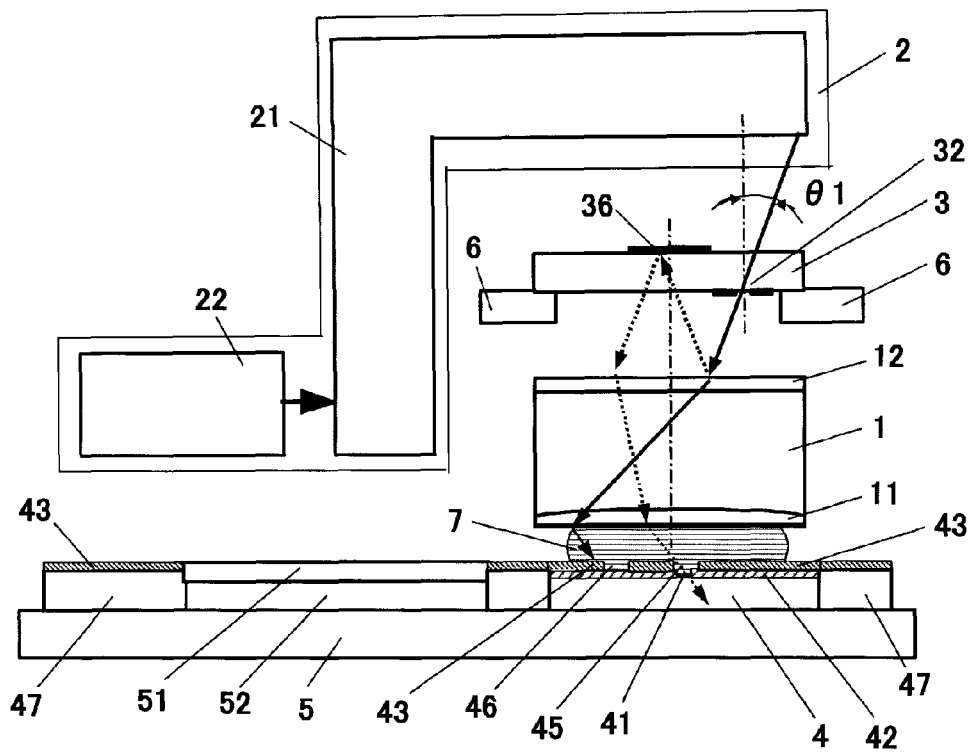
FIG. 15 is a comparative diagram with respect to an exposure apparatus in a third embodiment of the present invention.

For comparison with FIG. 14, in the immersion exposure apparatus which is provided with the same peeled areas 45 and 46 as those of FIG. 3, FIG. 15 shows the case where the wafer stage 5 is set to be the same position as that of FIG. 14.

As shown in FIG. 15, the light beam reflected on the surface of the reticle side optical element 12 of the projection optical system 1 is, similarly to the case of FIG. 14, introduced to the light receiving opening 41 of the light intensity sensor 41. The light beam which has passed through the light receiving opening 41 is received and photo-electrically converted by the light intensity sensor 4.

On the other hand, the light beam which has transmitted through the reticle side optical element 12 is condensed on the water repellent coating layer 43 which contacts the liquid 7, via the projection optical system 1. Therefore, contaminants are generated by the water repellent coating layer 43. Thus, in the immersion exposure apparatus which is provided with the wafer stage 5 having the peeled areas 45 and 46, when the reflectance measurement of the reticle side optical element 12 is performed in a condition that the incident angle is θ1, there is a problem that the contaminants are generated by the water repellent coating layer 43.

On the other hand, as shown in FIG. 14, if the light intensity sensor 4 having the horizontally long peeled area 400 of FIG. 13 is used, the contaminants from the water repellent coating layer are not generated. Therefore, the reflectance measurement of the reticle side optical element 12 can be performed in a condition that the incident angle of the monopole obliquely incident light beam is set to θ1.

Next, in the immersion exposure apparatus which is provided with the light intensity sensor 4 having the peeled area 400 of FIG. 13, in the case where the incident angle of the monopole obliquely incident light beam to the reticle 3 is set to θ2, the reflectance measurement of the wafer side optical element 11 will be described.

Figure 16:
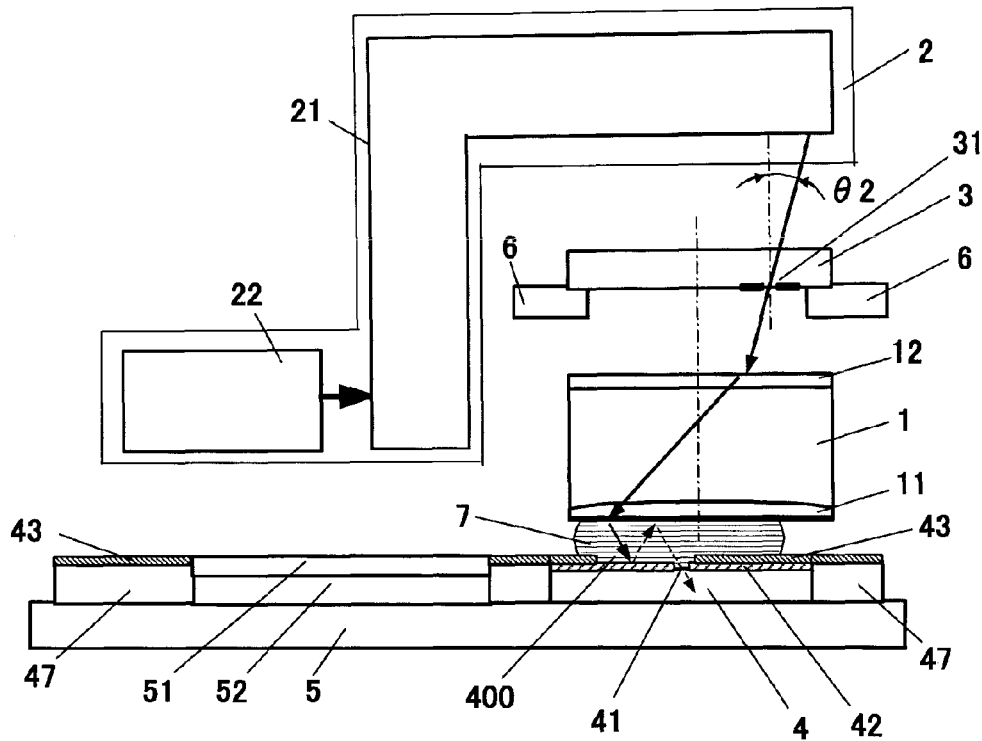
FIG. 16 is a schematic configuration diagram of an exposure apparatus in a third embodiment of the present invention.

FIG. 16 is a schematic configuration diagram of the exposure apparatus in the present embodiment. As shown in FIG. 16, the light beam which has transmitted through the light transmissive opening pattern 31 formed on the reticle 3 passes through the projection optical system 1 and the liquid 7, is condensed on the peeled area 400 of the water repellent coating layer 43 provided on the wafer stage 5, and is reflected by the reflective surface 42.

The light beam which has been reflected on the reflective surface 42 in the peeled area 400 is reflected on the surface of the wafer side optical element 11 that is an immersion surface of the projection optical system 1 and passes through the light receiving opening 41 which is placed in the peeled area 400. The light beam which has passed through the light receiving opening 41 is received and photo-electrically converted by the light intensity sensor 4.

Figure 17:
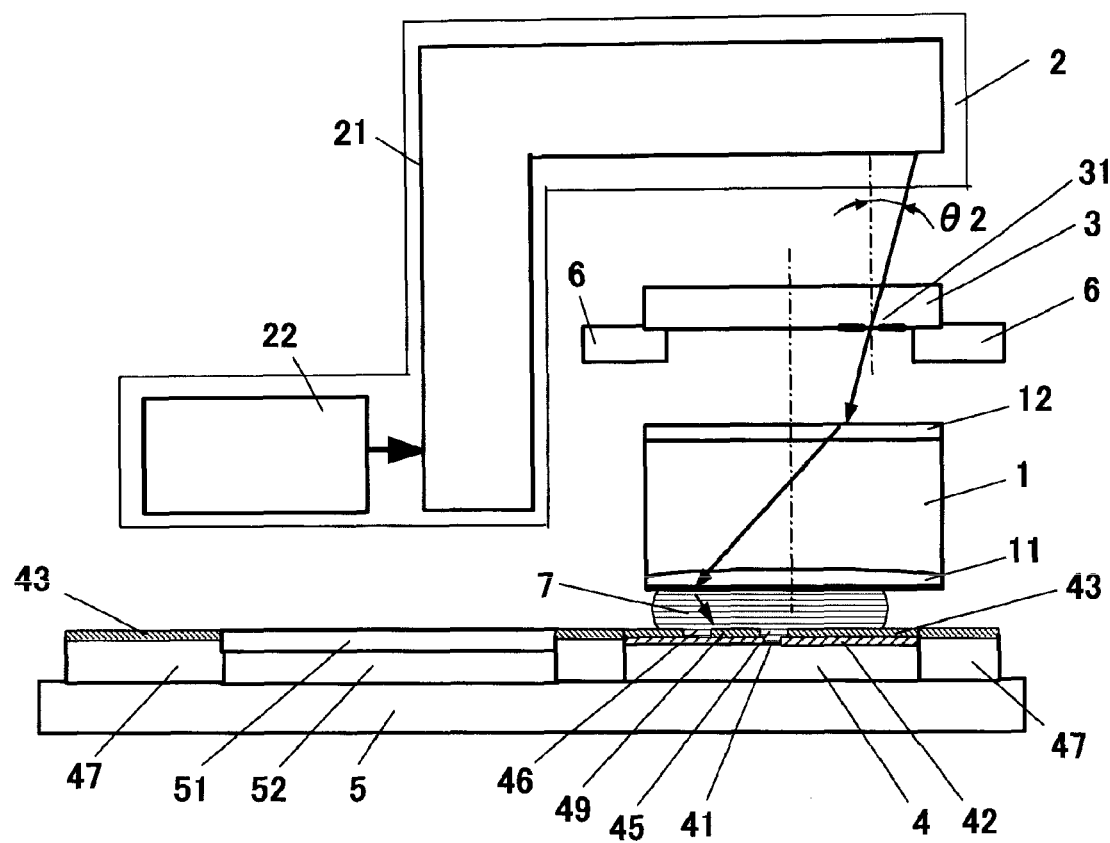
FIG. 17 is a comparative diagram with respect to an exposure apparatus in a third embodiment of the present invention.

For comparison with FIG. 16, in the immersion exposure apparatus which is provided with the peeled areas 45 and 46 of FIG. 3, FIG. 17 shows the case where the wafer stage 5 is set to be the same position as that of FIG. 16.

In FIG. 17, the light beam which has passed through the light transmissive opening pattern 31 formed on the reticle 3 passes through the projection optical system 1 and the liquid 7 and is condensed on the water repellent coating layer 49. Therefore, there is a problem that the contaminants are generated by the water repellent coating layer 49. Thus, in the immersion exposure apparatus which is provided with the peeled areas 45 and 46 of FIG. 3, when the reflectance measurement of the wafer side optical element 11 is performed in a condition that the incident angle of the monopole obliquely incident light beam to the reticle 3 is $\theta 2$, there is a problem that the contaminants are generated by the water repellent coating layer 49.

On the other hand, as shown in FIG. 16, according to the immersion exposure apparatus which is provided with the horizontally long peeled area 400 of FIG. 13, the contaminants from the water repellent coating layer are not generated. Therefore, the reflectance measurement of the wafer side optical element 11 can be performed in a condition that the incident angle of the monopole obliquely incident light beam is set to $\theta 2$.

Although FIGS. 14 and 16 showed examples of incident angles $\theta 1$ and $\theta 2$, respectively, the present embodiment is not limited to these. According to the present embodiment, the reflectance measurement of the wafer side optical element 11 and the reticle side optical element 12 of the projection optical system 1 can be performed without limiting the incident angle of the monopole obliquely incident light beam to the reticle 3.

Thus, in the present embodiment, an incident angle variable unit (not shown) which changes the incident angle of the light entering the projection optical system 1 is provided. An arithmetic processing unit (not shown) can calculate the reflectance of the wafer side optical element 11 and the reticle side optical element 12 for each of a plurality of incident angles set by the incident angle variable unit.

In each of the above embodiments, a direction in which the peeled areas 45 and 46 of FIG. 3 are in line (a direction of an arrow indicating length d2) or a longitudinal direction of the peeled area 400 of FIG. 13 (a direction of an arrow indicating length d3) is not limited to this. However, if the immersion exposure apparatus is constituted as a scanning exposure apparatus (a scanner), the exposure area mostly has a horizontally long shape such as a rectangular shape or a circular arc shape.

When the reflectance measurement of the reticle side optical element 12 of the projection optical system 1 shown in FIGS. 6 and 14 is performed, lights passing through the projection optical system 1 separately exist. Therefore, it is more preferable that the peeled area is placed in a condition that its horizontally long direction matches the horizontally long direction of the exposure area.

A device (a semiconductor integrated circuit device, a liquid crystal display device, or the like) is manufactured by a process of exposing a substrate (a wafer, a glass plate, or the like) coated by a photosensitizing agent using the exposure apparatus of one of the above embodiments, a process of developing the substrate, and other well-known processes.

According to each of the above embodiments, an immersion exposure apparatus which is capable of measuring the reflectance of the optical element constituting the projection optical system with a simple configuration can be provided. Furthermore, a device manufacturing method using the immersion exposure apparatus can be provided.

Particularly, according to each of the above embodiments, an immersion exposure apparatus which suppresses the deterioration of the water repellent coating layer is provided. Furthermore, the reflectance of the optical element constituting the projection optical system can be measured with high accuracy in a state where the space between the projection optical system and the drive stage is filled with liquid.

According to each of the above embodiments, the reflectance measurement of the outermost optical element surface which constitutes an immersion projection optical system can be performed with high accuracy without a light receiving element influenced by the incident angle characteristics of the light. Furthermore, it can be achieved only by a simple configuration in which a reflective surface is provided on a wafer stage or a measurement reticle having a reflective surface is used in the immersion exposure apparatus.

The deteriorated part of the optical element in the immersion exposure apparatus can be correctly specified. The exchange timing of the optical element which constitutes the immersion projection optical system can be correctly recognized. Therefore, the projection optical system can be maintained in a good condition, and semiconductor devices with high performance can be manufactured with high yield and high throughput.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-116607, filed on Apr. 28, 2008, which is hereby incorporated by reference herein in its entirety.

What is claimed is:

1. An immersion exposure apparatus configured to expose a substrate via liquid between a projection optical system and the substrate, the immersion exposure apparatus comprising:
   an optical element constituting a part of the projection optical system;
   a reflective member configured to reflect light to the projection optical system;
   a water repellent member in which one or more openings are formed;
   a light intensity detecting unit configured to detect a light intensity of a first light and a second light; and
   an arithmetic processing unit configured to calculate a reflectance of the optical element based on the light intensity of the first light and the second light,
   wherein the first light is light which enters the projection optical system, passes through one of the one or more openings of the water repellent member to be reflected by the reflective member, is reflected on a surface of the optical element, and passes through one of the one or more openings to be received by the light intensity detecting unit, and
   wherein the second light is light which enters the projection optical system and passes through one of the one or more openings of the water repellent member to be received by the light intensity detecting unit without being reflected on the reflective member and the surface of the optical element.

2. An immersion exposure apparatus according to claim 1, wherein the water repellent member and the light intensity detecting unit are provided on a stage,
   wherein the first light is light which is detected with the stage placed at a first position, and wherein the second light is light which is detected with the stage placed at a second position differing from the first position.

3. An immersion exposure apparatus according to claim 1, wherein the at least one opening of the water repellent member includes a first opening and a second opening,
wherein the first light is light which enters the projection optical system, passes through the first opening of the water repellent member to be reflected by the reflective member, is reflected on the surface of the optical element, and passes through the second opening to be received by the light intensity detecting unit, and
wherein the second light is light which enters the projection optical system and passes through the second opening of the water repellent member to be received by the light intensity detecting unit without being reflected on the reflective member and the surface of the optical element.

4. An immersion exposure apparatus according to claim 1, further comprising an illumination optical system configured to illuminate an original plate using light from a light source,
wherein the illumination optical system includes an optical shaping unit configured to shape the light so that the light from the light source obliquely enters the projection optical system at a predetermined incident angle, and
wherein the arithmetic processing unit calculates the reflectance of the optical element based on the first light and the second light which have obliquely entered the projection optical system at the predetermined incident angle.

5. An immersion exposure apparatus according to claim 4, further comprising an incident angle variable unit configured to change the incident angle of the light which obliquely enters the projection optical system,
wherein the arithmetic processing unit is capable of calculating the reflectance of the optical element for each of a plurality of incident angles set by the incident angle variable unit.

6. An immersion exposure apparatus configured to expose a substrate via liquid between a projection optical system and the substrate, the immersion exposure apparatus comprising:
an optical element constituting a part of the projection optical system;
a reflective member configured to reflect light to the projection optical system;
a water repellent member in which one or more openings are formed;
a light intensity detecting unit configured to detect a light intensity of a first light and a second light; and
an arithmetic processing unit configured to calculate a reflectance of the optical element based on the light intensity of the first light and the second light,
wherein the first light is light which is reflected on a surface of the optical element and the reflective member, enters the projection optical system, and passes through one of the one or more openings of the water repellent member to be received by the light intensity detecting unit, and
wherein the second light is light which enters the projection optical system and passes through one of the one or more openings of the water repellent member to be received by the light intensity detecting unit without being reflected on the surface of the optical element and the reflective member.

7. An immersion exposure apparatus according to claim 6, wherein the reflective member is provided on an original plate.

8. A device manufacturing method comprising the steps of:
exposing a substrate using an immersion exposure apparatus; and
developing the exposed substrate,
wherein the exposure apparatus is configured to expose the substrate via liquid between a projection optical system and the substrate, the immersion exposure apparatus comprising:
an optical element constituting a part of the projection optical system;
a reflective member configured to reflect light to the projection optical system;
a water repellent member in which one or more openings are formed;
a light intensity detecting unit configured to detect a light intensity of a first light and a second light; and
an arithmetic processing unit configured to calculate a reflectance of the optical element based on the light intensity of the first light and the second light,
wherein the first light is light which enters the projection optical system, passes through one of the one or more openings of the water repellent member to be reflected by the reflective member, is reflected on a surface of the optical element, and passes through one of the one or more openings to be received by the light intensity detecting unit, and
wherein the second light is light which enters the projection optical system and passes through one of the one or more openings of the water repellent member to be received by the light intensity detecting unit without being reflected on the reflective member and the surface of the optical element.

9. A device manufacturing method comprising the steps of:
exposing a substrate using an immersion exposure apparatus; and
developing the exposed substrate,
wherein the exposure apparatus is configured to expose the substrate via liquid between a projection optical system and the substrate, the immersion exposure apparatus comprising:
an optical element constituting a part of the projection optical system;
a reflective member configured to reflect light to the projection optical system;
a water repellent member in which one or more openings are formed;
a light intensity detecting unit configured to detect a light intensity of a first light and a second light; and
an arithmetic processing unit configured to calculate a reflectance of the optical element based on the light intensity of the first light and the second light,
wherein the first light is light which is reflected on a surface of the optical element and the reflective member, enters the projection optical system, and passes through one of the one or more openings of the water repellent member to be received by the light intensity detecting unit, and
wherein the second light is light which enters the projection optical system and passes through one of one or more openings of the water repellent member to be received by the light intensity detecting unit without being reflected on the surface of the optical element and the reflective member.

* * * * *